United States Patent [19]

Oscarsson et al.

[11] 4,032,233

[45] June 28, 1977

[54] EXPOSURE REGISTRY APPARATUS

[75] Inventors: Rolf Arne Oscarsson, Pedricktown, N.J.; Nathaniel Convers Wyeth, Mendenhall, Pa.

[73] Assignee: E. I. Du Pont de Nemours and Company, Wilmington, Del.

[22] Filed: May 3, 1976

[21] Appl. No.: 682,721

[52] U.S. Cl. .................................................. 355/91
[51] Int. Cl.² ......................................... G03B 27/20
[58] Field of Search ................... 355/91, 93, 94, 87, 355/73

[56] References Cited

UNITED STATES PATENTS

| | | | |
|---|---|---|---|
| 3,479,121 | 11/1969 | Burgess | 355/91 X |
| 3,695,760 | 10/1972 | Orr | 355/95 |
| 3,927,943 | 12/1975 | Pohl et al. | 355/91 X |

*Primary Examiner*—Richard L. Moses

[57] ABSTRACT

The apparatus described facilitates the registry of image bearing transparencies with a plate having a photosensitive coating thereon. After exposure to light, the plate typically is subjected to chemical milling processes to produce printed circuit boards and the like. The registry apparatus includes upper and lower frames which form an enclosed region therebetween in which the plates and transparencies are placed in sandwich relationship. An outer gasket between the frames permits a vacuum to be applied to the enclosed region. An inner perimeter channel is formed in the opposed faces of each frame to permit a separate vacuum to hold the transparencies in place while the frames are opened to remove, insert or replace a plate. Successive plates may be processed without the necessity of re-registering the transparencies prior to each exposure.

8 Claims, 12 Drawing Figures

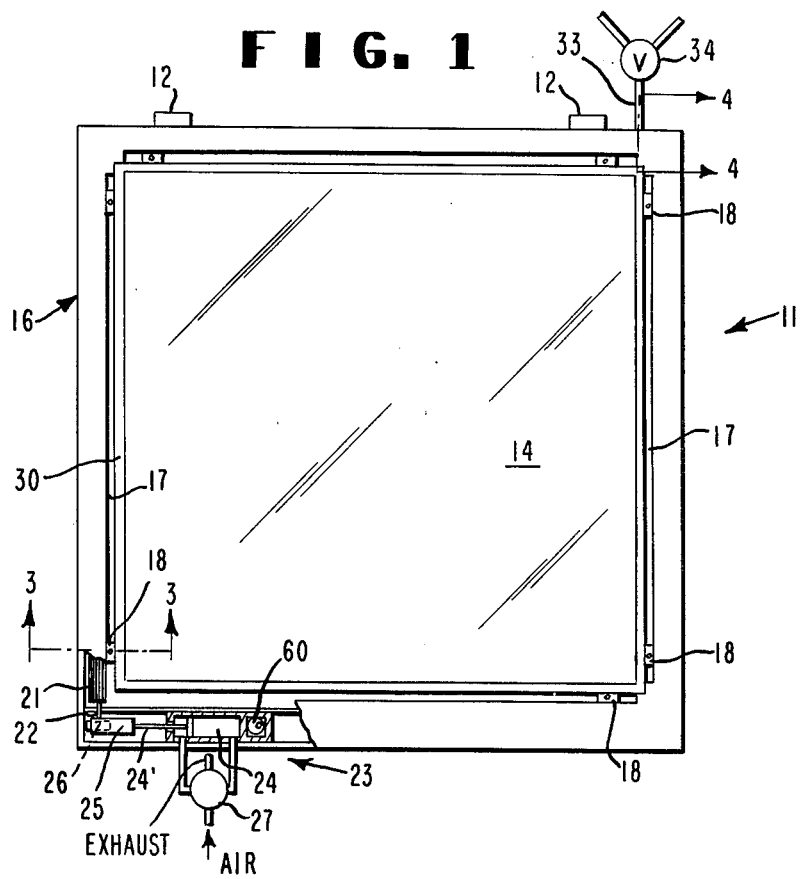
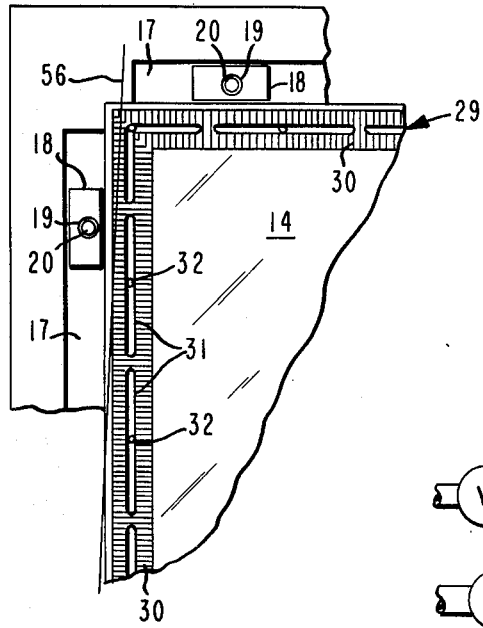
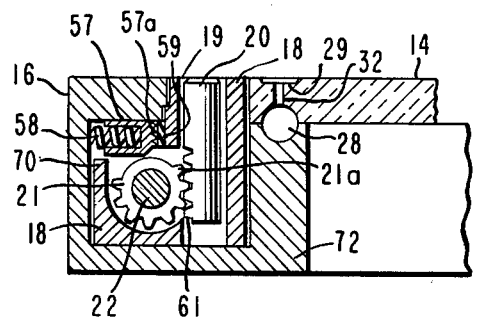
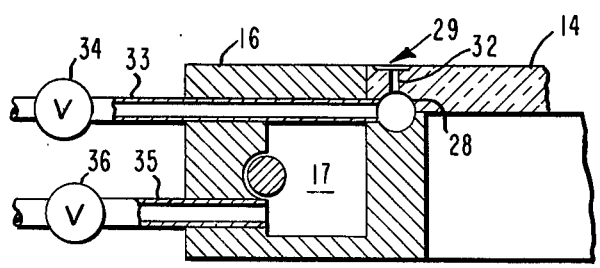

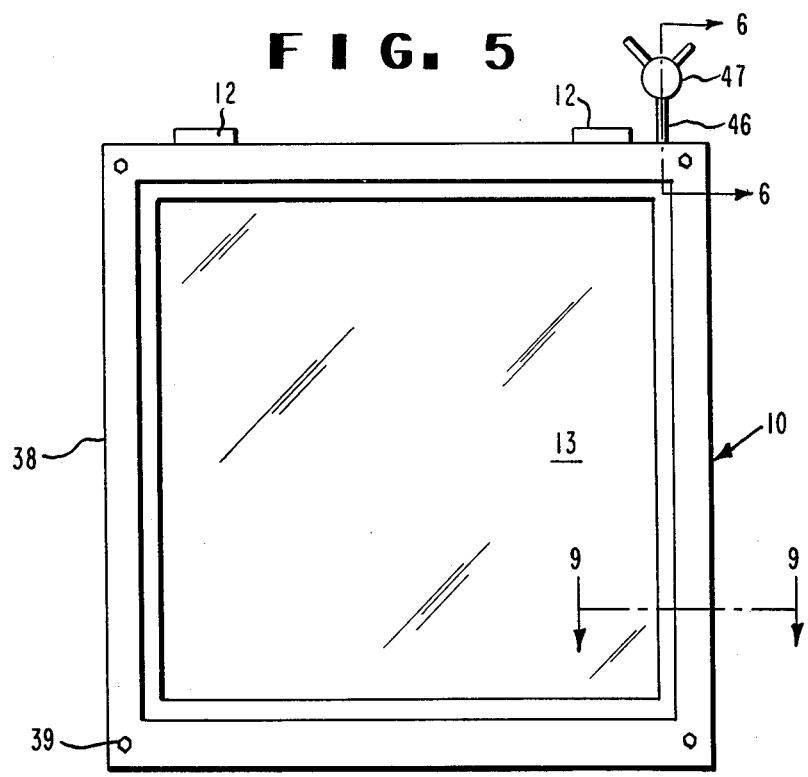
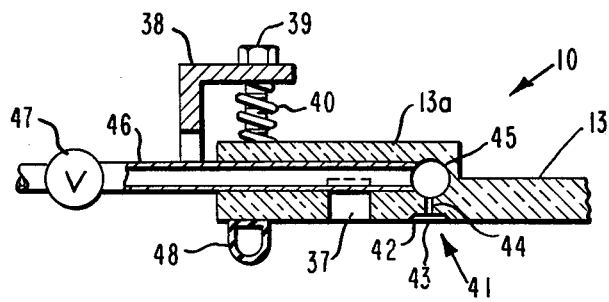
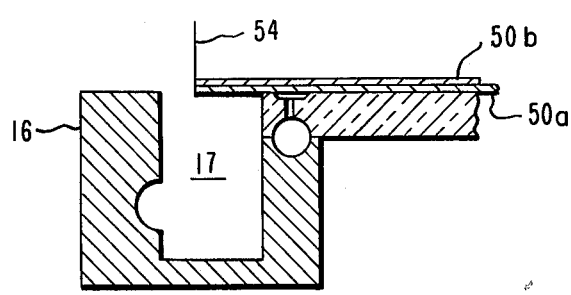
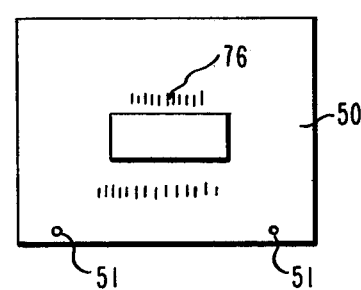

EXPOSURE REGISTRY APPARATUS

BACKGROUND OF THE INVENTION

This invention relates to apparatus for the exposure of photosensitive material coated on plates and, more particularly, to apparatus for properly registering intelligence bearing transparencies for use in exposing photosensitive materials on plates to a source actinic radiation.

Much has been done in the field of printed circuit boards over the past few years. Typically a board to be treated is coated with a photosensitive or photo-resist material and exposed to light through a transparent master (artwork) containing the desired circuit layouts. The exposed (or unexposed) regions of the treated material are then chemically treated and dissolved, leaving only the desired pattern on the board which now may be further processed as desired.

Although the chemical processing is by now relatively well known and well developed, a particular problem arises in the registering of the transparent masters and retaining them in position for exposing successive boards to the same circuit patterns. Registration is a particular problem when it is required to expose both sides of a board coated with photosensitive material.

It has been general practice to employ a pair of open frames to support the transparent master, usually glass or plastic, and to secure the master(s) to either or both of the frames by various means including spring clips, screw clamps, strips of pressure-sensitive adhesive or the like. Indicia on the face of each transparent master permit visual alignment of paired masters that are to be used in exposing both sides of a given board. After alignment, the masters are manually secured to the respective frames. The photopolymer coated boards (laminates) are inserted between the masters, exposed to actinic radiation, and removed. While such a procedure may be satisfactory for long production runs in which many duplications are made, in a situation in which one or only a few boards are to be treated after which the master is removed and replaced by a different master, these repetitive procedures incident to installing of the different masters are time-consuming and costly.

One method of securing the masters and coated circuit boards together prior to exposure to light has been to subject the entire region between the frames to a vacuum. While this proven generally satisfactory, one problem that has arisen is that if any portion of the surface area of the transparent region of the frames becomes uncovered by the masters or other sheet-like material, often the vacuum is destroyed and the sheets not securely held. This requires additional time in that the person installing the masters, must spend considerable time cutting and trimming to be certain of covering all of the vacuum apertures.

Accordingly, it is an object of this invention to obviate many of the disadvantages of the prior art contact exposure devices.

A further object of this invention is to provide an improved apparatus for registering and holding in registry, transparent masters for use in exposing photosensitive materials to images.

BRIEF DESCRIPTION OF THE INVENTION

According to a preferred embodiment of this invention, apparatus for subjecting a photosensitive material disposed on a sheet-like support to actinic radiation through an image producing transparency includes first and second sandwich-like frame assemblies each having an opposed surface adapted to hold said support and transparency therebetween at least one of said surfaces being radiation transmitting, peripheral sealing means secured to one of said assemblies for providing an air-tight seal between said assemblies when closed, first vacuum means defining an aperture for subjecting the enclosed region between said closed assemblies and hence the edges of said support and said transparency to a vacuum thereby to force said support and transparency together, an inner recess formed in the inner face of said one surface within the confines of the peripheral sealing means and interiorly of said aperture, and second vacuum means for subjecting said recess to a vacuum, thereby to hold the transparency in position while replacing said support.

In a particularly preferred embodiment, said recess is defined by plural lateral serrations interconnected in groups by discontinuous grooves to said second vacuum means. Separate orifices, each having a restricted cross-sectional area, interconnect said grooves to avert complete loss of vacuum in the event that the transparency does not completely cover all of the recess. Both of the support surfaces may have recesses formed therein to secure a transparency by the second vacuum means.

BRIEF DESCRIPTION OF THE DRAWINGS

Further advantages and features of this invention will become apparent upon consideration of the following description wherein:

FIG. 1 is a plan view partly cut away of the lower frame assembly of a photo-registration apparatus constructed in accordance with the present invention;

FIG. 2 is an enlarged fragmentary plan view of the upper left hand corner (in the drawing) of the frame of FIG. 1;

FIG. 3 is an enlarged cross-section taken along the section line 3—3 in FIG. 1 showing both sets of vacuum passageways and channels and a registry pin elevating and locking mechanism used in the lower assembly of FIG. 1;

FIG. 4 is an enlarged cross-sectional view taken along the section 4—4 of FIG. 1 showing conduits for connecting passageways and channels of FIG. 3 to an external source of vacuum;

FIG. 5 is a plan view of an upper frame assembly meant to be superimposed on the frame of FIG. 1 in a manner to be described to create the sandwich-type structure of this invention;

FIG. 6 is a fragmentary cross-section view taken along the section line 6—6 in FIG. 5 showing a conduit for connecting internal channels of the upper frame assembly to an external source of vacuum and showing means for sealing the upper frame relative to the lower one (not shown);

Figure 7A:
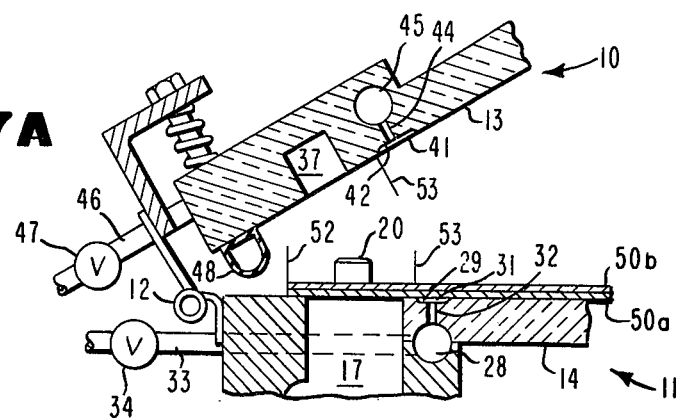
FIGS. 7A, 7B, 7C, and 7D show a partial cross-sections of both the upper and lower frame assemblies in cooperative relationship in the sequential positions that the parts accupy when art work and a sensitized plate are placed within the frame of the present invention.

The final FIG., 7D, shows a completely assembled unit ready to be irradiated to expose the sensitized plate;

FIG. 8 shows a typical transparency or art work intended for use in the apparatus of the present invention;

FIG. 9 is a partial cross-section view taken along the section line 9—9 of FIG. 1.

DETAILED DESCRIPTION

In general, referring to FIGS. 1, 5, and 7, the apparatus described below for registering and subjecting photosensitive materials to actinic radiation such as light, comprises an upper frame assembly 10 and a lower frame assembly 11 both of which are generally rectangular with an open aperture in the center and which are joined to each other by means of hinges 12. The aperture within each assembly 10, 11 is spanned by a light or actinic radiation transmitting surface such as transparent plastic sheets or glass 13, 14, respectively, both of which are relatively flat on their confronting surfaces.

Referring to FIGS. 1, 3, and 4, the lower assembly 11 comprises an aluminum or other rigid frame which is formed from U-shaped channels 16, partially open at the top, placed in a rectangular configuration. The open topped channels 16 define a groove 17 which is generally rectangular in cross-section, as seen in FIG. 4; these grooves 17 intersect each other at all four corners, thus forming a continuous groove about all four sides of the frame 16. The channels forming the frame 16 may be fastened at the corners by any suitable means. Occupying a portion of each groove 17 are one or more slidable blocks 18 which may be moved and locked in any position along the grooves.

Each block 18 has a vertical bore or hole 19 within which is a vertically slidable pin 20 having a rack 61 machined on one side which is engaged through an open lower side of the block by an interrupted pinion 21. The pinion is carried on a shaft 22 and both the shaft 22 and the pinion 21 extend along the sides of the frame 16 for substantially the entire length of each of the grooves 17. As viewed in FIG. 3, clockwise rotation of the shaft and gear will draw the pin 20 down within the hole 19 in block 18 until the upper end of the pin is flush with the upper surface of the block as shown.

In FIG. 1, such rotation is accomplished manually by a knob connected to the shafts 22 or by means of a pneumatic drive 23 which comprises a small pneumatic cylinder 24 whose piston 24' is connected to a rack 25 which drives a pinion 26, the latter being secured to one end of the shaft 22. The piston rod 24' is actuatable reversibly by means of a four-way valve 27 by which the cylinder 24 may be connected to a source of air under pressure (not shown) and to exhaust. Since it is necessary to withdraw or extend all of the pins 20 in the blocks 18, a shaft 22 runs through each of the four sides of the frame 16, but only one shaft 22 is shown (fragmentarily) on the left side of FIG. 1. The shafts are interconnected at three corners of the frame 16 by means of paired miter gears (not shown) and supported by bearings (not shown) formed by the outside wall of the frame 16. An additional increment of angular motion of pinion 26, shaft 22 and pinion 21 is provided by means of the eccentric 60 (FIG. 1) which rotatably mounted in the frame 16 and which, one being rotated by a handle (not shown), moves the body of the cylinder 24 between an actuated position to the right from the "rest" position shown. This is for the purpose of releasing a locking mechanism for the blocks 18 as will be described below.

The blocks, although they are manually slidable along the groove 17, are normally "locked" into position by means of an actuating bar 57 located in the upper portion of each groove 17 which bar extends for the full length of each groove. The bar 57 is supported by a U-shaped side extension 70 of each block. The bar 57 is urged to the right (FIG. 3) toward the right side of the block 18 by means of small helical springs 58 positioned in spaced bores formed in the bar 57 which is provided with vertical teeth 57a in its right-hand side adapted to engage a thin strip of elastromeric material 59 secured to the outer side of the blocks 18. This normally engaged, friction lock is released by rotating the shaft 22 and pinion 21 counterclockwise, by means of the eccentric 60 on cylinder 24. When thus actuated, this causes the "last" tooth 21a on interrupted gear 21 to engage the edge of bar 57, thus moving it to the left (in the drawing) away from block 18. After the blocks are released, they are manually moved to a desired position along groove 17, and are locked again by rotating the eccentric 60 in the opposite direction. The bar 57 serves also to limit the counterclockwise rotation and hence the upward movement of the pins 20.

Referring to FIG. 3, the inner side 72 of each channel 16 is shortened in height to accommodate the transparent plastic sheet 14. The edges of the sheet are secured as by cement to the frame channel upright 72. A passageway 28 is formed between the upper surface of the side 72 and the lower peripheral surface of the sheet 14 to be a continuous passage 28 around the entire perimeter of frame 16 and sheet 14. On the upper face or surface of the plastic sheet 14, directly above the passageway 28, is a shallow elongated recess 29 which extends around the entire perimeter of the sheet (this is shown fragmentarily in plan view, FIG. 2). The entire recess is transversely serrated by which is meant that it is provided with an "endless" series of parallel, transverse, V-shaped serrations 30 which extend across the elongated recess 29. In the surface of the sheet 14, in the line of the recess 29, are narrow, shallow grooves 31 (preferably of the same depth as serrations 30) of limited extent (e.g., about 1 inch long) which interconnect groups of the serrations. Centrally of each of the grooves 31 is a single orifice 32 (seen also in FIG. 3) which connects each groove 31 with the passageway 28. As shown in FIG. 4, the passageway 28 is intersected by a tube 33 which extends outwardly from the frame 16, on the hinged side, and is adapted to be connected to a three-way valve 34 the other ports of which connect a source of vacuum (not shown) and to the ambient atmosphere, respectively.

Similarly the groove 17 (FIG. 4) communicates with a tube 35 having a three-way valve 36 for connection to vacuum or atmosphere but which valve is manually operable independently of the valve 34.

Referring to FIGS. 5 and 6, the upper assembly 10 generally comprises a rigid frame 38 made of any suitable angle material such as aluminum, the outer boundaries of which are slightly larger than the lower frame 16 and a transparent sheet 13 which is flat on its lower face or surface but has a thicker portion 13a around its entire perimeter. The sheet 13 may be hung from the angle frame 38 by means of four machine screws 39, one at each corner, which engate threaded holes in the upper part of the thicker portion 13a. Compression springs 40 urge the plastic sheet 13 downward, away from the frame 38. The lower face or surface of the sheet 13 is provided with an elongated, perimeter recess 41 which is substantially indentical to the recess 29 in sheet 14. When the sheets 13, 14 are superimposed on each other the two recesses 29, 41 preferably are coextensive but need not be so. The upper recess 41 likewise has transverse serrations 42, central shallow longitudinal grooves 43 interconnecting groups of the serrations 42, and orifices 44 which interconnect the grooves 43 with the passageway 45 formed within the thicker perimeter portion 13a of sheet 13. Both the passageway 45 and the recess 41 extend around the entire perimeter of the sheet 13. A tube 46 extends from the passageway 45, through the edge of the sheet 13 to a three-way valve 47 the other ports of which communicate with a source (not shown) of vacuum and the ambient atmosphere, respectively. In addition, the lower face has an elongated slot 37 which, when the upper assembly 10 is placed over the lower one 11, serves to align the two by engagement with the upper ends of the pins 20.

As seen in FIG. 6, on the lower face of the sheet 13, generally outside the recess 41, is a continuous resilient or hollow gasket 48, the upper portion of which maybe secured to the sheet 13 by adhesive while the lower portion is available to bear against the face of the lower frame 16 in a manner to be described. The interior of the gasket is sealed relative to the ambient atmosphere so as to provide more resistance to flattening due to externally applied mechanical loading than would an open-ended tube. This construction also permits greater accommodation of the gasket to different thickness of materials placed between the sheets 13, 14 as will be described.

Referring to FIG. 8, there is depicted an image producing transparency 50, typically referred to as "artwork" in printed circuit board production. Thus, the art work 50 generally comprises a transparent sheet of film bearing images or intelligence 76. At least one edge of the film extends outwardly from the intelligence bearing portion to allow space for at least two spaced registry perforations 51 each having a diameter substantially equal to or only very slightly larger than the diameter of the pins 20 in the lower frame 16. The perforations 51 have a preselected geometrical and dimensional relationship to certain features of the intelligence and serve to locate the art work repetitively and with precision relative to a point or line on a sensitized plate or other sheet-like support 15, having sensitized photo materials on one both surfaces. The artwork intelligence (or pairs of artwork) is to be transferred or reproduced on opposite sides of a sensitized support or circuit board in precise registry.

In use, the upper assembly 10 of the apparatus of the present invention is opened on its hinges and kept open as shown generally FIG. 7A after which the upper and lower artwork 50a and 50b are placed over the pins 20 in the lower assembly 11; for this purpose the pins 20 are unlocked and may have to be manually moved together or apart along groove 17 for match-up with the registry perforations 51 after which they are locked again.

The side of the artwork that engates the pins 20 should usually extend outwardly to about line 52 (FIG. 7A) and the remaining sides at least as far as line 53, which line coincides with or extends slightly beyond the outer perimeter of either of the recesses 29 or 41 (FIG. 7A). Of the remaining sides, two may extend as far as line 52 or 53 (if desired), however, the last or third side, while it must extend at least as far as line 53, so as to cover the serrations 30, should not extend so far as to cover the entire width of the groove 17 and preferably should cover not more than about 0.6 to 0.8 of the width of the groove 17; i.e., not beyond a point depicted by line 54, FIG. 9. In the following description, the above described third side is referred to as the "open side."

At this stage of emplacing the artwork, if part of the artwork (say on one or two sides) does not extend at least to line 53, as described above, then it is necessary to place masking material (not shown but similar to the artwork film) over the part of the perimeter or side of the artwork that is short to cover the serrations 30, but with the stipulation that at least one side of the artwork or of the mask must provide an "open side" to the groove 17. The masking material may, of course, be secured to the edge of the artwork 50 by adhesive, if desired.

Figure 7B:
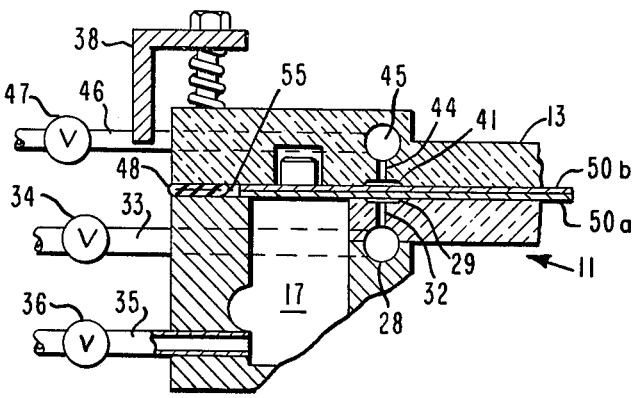

Next, with the artwork in place, the upper assembly 10 is swung on the hinge and then closed against the lower assembly 11 until the lower face of plastic sheet 13 abuts the upper side of the upper artwork 50b, FIG. 7B. After this, the groove supply valve 36 is opened to apply vacuum to the groove 17, around all four sides of frame 16, and thence via the "open side" of the artwork to the generally annular space 55 outside the edges of the artworks 50a, 50 b, and inside the gasket 48 with the effect that this annular space and the entire space between plastic sheets 13, 14 is evacuated or outgassed. Atmospheric pressure will, of course, squeeze the sheets together and assist in forcing air bubbles out and will also cause deformed sheets to conform to each other, becoming generally flat.

As a third step, after a short time interval, the recess supply valves 34 and 47 are manipulated to apply vacuum to passageways 28 and 45, respectively, and thence via orifices 32 and 44 to recesses 29 and 41, respectively, having the effect of drawing the perimeters of each of the art works 50a, 50b firmly against each of their respective sheets 13, 14 to secure them thereto so long as the vacuum is maintained.

Following this, the groove supply valve 36 is manipulated to close off the connection to the source of vacuum and simultaneously to vent the tube 35 to the ambient atmosphere, thus allowing pressure in groove 17 and hence the annular space 55 to be restored to that of the ambient atmosphere. This allows the upper assembly 10 to be lifted or opened, FIG. 7C; artwork 50b is, of course, carried with it, being held by the vacuum applied to the upper recess 41 by recess supply valve 47.

Figure 7C:
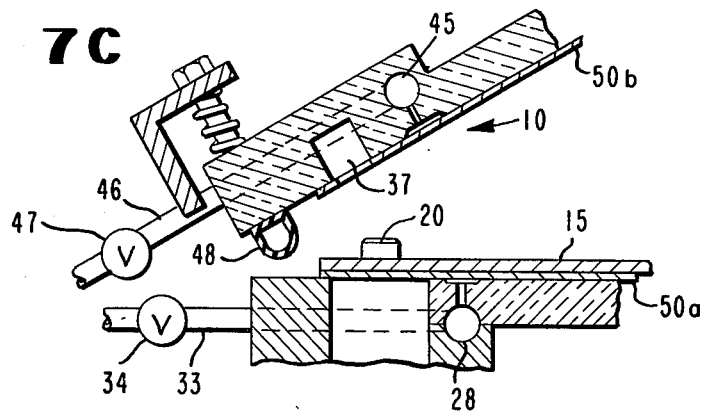

In a fifth step, FIG. 7C, a sensitized plate 15 (e.g., Du Pont Riston photopolymer film resist), having holes to match the hole 51 size and location is placed over the art work 50a and over the pins 20 to insure proper alignment or registry with the artwork.

Figure 7D:
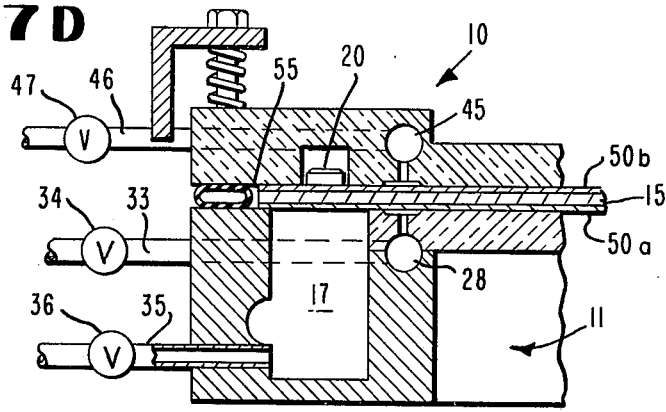

In the sixth step, the apparatus is again closed, FIG. 7D, after which groove supply valve 36 is set to apply vacuum to the groove 17 once again. Since the gasket 48 seals the entire perimeter of the assembly, this application of vacuum has the effect of drawing both artworks 50a, 50b into intimate contact with both sides of the sensitized plate 15 and of holding the entire assembly in position. Of course neither the artwork nor the plate 15 should close off the "open side" of the artwork access to the groove 17. The sensitized plate 15 is now subjected to ultraviolet or actinic radiation both from the top and the bottom to expose both sides (a single side may be exposed if desired in which event a single artwork is used and one or the other of the recess supply valves 34 or 47 is operated).

In a final step, the groove valve 36 is turned to restore atmospheric pressure to the groove 17 after which the apparatus is opened, the pins 20 are withdrawn and the plate 15 is released and manually removed for development by conventional means.

In the meantime, recess vacuum valves 34 and 47 are left open to vacuum, thus holding the artworks in their respective positions; steps five through seven (above) may now be repeated; i.e., an unexposed sensitized plate may be placed, registered, subjected to vacuum, exposed and removed all in a short period of time and without any necessity for realigning the art works.

Although in the above discussion relating to emplacement and positioning of the edges of the art work (or of the mask) it is stated that these edges should overlie the recesses 29 and 41 at least to line 53, another feature of the present invention permits some leeway in this. Referring to FIGS. 2 and 4, each orifice 32 opens into passageway 28 as well as to a single shallow channel groove 31 of finite length which latter communicates with recess 29 via serrations 30. If the edge portion of an art work lies along an angled line such as line 56 (FIG. 2) inadvertently exposing a portion of the recess (to the left of the line 56 in the drawing) to the ambient atmosphere, in general, this will have substantially little or no effect on the functioning of the apparatus. When passageway 28 is evacuated, the ambient air entering recess 29 that is able to flow into passageway 28 must enter via serrations 30, groove 31 and orifice 32; since the cross-sectional area of the orifice 32 is quite small in relation to the cross-sectional area of the passageway 28 (e.g. an area ratio of 10 to 1) the influx of ambient air is at such a low rate as to preclude an appreciable rise in pressure in passageway 28; i.e., essentially "full" vacuum will be maintained which means that substantially all of the remainder of recess 29 remains at the desired subatmospheric level of pressure and therefore, the artwork (or mask) is held quite securely relative to the plastic sheet 13 or 14.

There has thus been described a relatively simple, yet precise apparatus for registering the repeatedly exposing sensitized plates through an image producing transparency. The transparency and plates on the one hand are subjected to a vacuum to facilitate imaging and on the other hand, the transparencies are retained in registry on their respective frames each by separate vacuum systems.

We claim :

1. Apparatus for subjecting a phtotsensitive material disposed on a sheet-like support to actinic radiation through an image producing transparency comprising, in combination:
   first and second sandwich-like frame assemblies each having opposed surfaces adapted to hold said support and transparency therebetween, at least one of said surfaces being radiation transmitting,
   perimeter sealing means for providing an air-tight seal between said assemblies when closed,
   first vacuum means defining an aperture for subjecting the enclosed region between said closed assemblies and hence the edges of said support and transparency to a vacuum, thereby to force said support and transparency together,
   an inner recess formed in the inner face of said one surface within the confines of said perimeter sealing means and interiorly of said aperture, and
   second vacuum means for subjecting said recess to a vacuum, thereby to hold said transparency in position while replacing said support.

2. Apparatus according to claim 1 wherein said recess is elongated and includes lateral serrations, thereby to increase the region of vacuum application to said transparency.

3. Apparatus according to claim 1 wherein said recess defines a plurality of discontinous grooves in one inner face interconnecting said serrations, and orifices having a restricted cross-sectional area interconnecting said second vacuum means and said grooves, thereby to avert complete loss of vacuum in the event said transparency does not completely cover all of said recess.

4. Apparatus according to claim 3 wherein said recess is divided into longitudinal segments.

5. Apparatus according claim 1 wherein said transparencies are adapted to be disposed on each side of said support and which includes a second inner peripheral recess in the inner face of the other said support surface within the confines of said peripheral sealing means and interiorly of said aperture, and
   a third vacuum means for subjecting said second recess to a vacuum, thereby to hold both transparencies in position while replacing said support.

6. Apparatus according to claim 5 wherein said second recess is elongated and includes lateral serrations, thereby to increase the region of vacuum application to said transparency.

7. Apparatus according to claim 5 wherein said second recess defines a plurality of discontinous grooves in said other inner face interconnecting said serrations, and orifices having a restricted cross-sectional area interconnecting said third vacuum means and second recess grooves, thereby to avert complete loss of vacuum in the event said transparency does not completely cover all of said second recess.

8. Apparatus according to claim 7 wherein said recess is divided into longitudinal segments.